(12) United States Patent
Fox

(10) Patent No.: US 6,465,820 B1
(45) Date of Patent: Oct. 15, 2002

(54) CMOS COMPATIBLE SINGLE PHASE CCD CHARGE TRANSFER DEVICE

(75) Inventor: Eric Fox, Waterloo (CA)

(73) Assignee: Dalsa, Inc., Waterloo (CA)

( * ) Notice: Subject to any disclaimer, the term of this patent is extended or adjusted under 35 U.S.C. 154(b) by 0 days.

(21) Appl. No.: 09/393,312

(22) Filed: Sep. 10, 1999

Related U.S. Application Data

(60) Provisional application No. 60/100,557, filed on Sep. 16, 1998.

(51) Int. Cl.$^7$ ............................................. H01L 27/148
(52) U.S. Cl. ....................... 257/223; 257/215; 257/216; 257/222
(58) Field of Search ...................... 257/215–16, 222–23, 257/218–19, 221, 225, 231–33, 288, 290.93; 377/58, 60

(56) References Cited

U.S. PATENT DOCUMENTS

| | | | |
|---|---|---|---|
| 4,229,752 A | 10/1980 | Hynecek | 257/217 |
| 4,668,971 A | 5/1987 | Hynecek | 257/239 |
| 4,673,963 A | 6/1987 | Hynecek | 257/230 |
| 4,779,124 A | 10/1988 | Hynecek | 257/217 |
| 4,831,451 A | 5/1989 | Hynecek | 348/281 |
| 4,878,121 A | 10/1989 | Hynecek | 348/319 |
| 4,994,875 A | 2/1991 | Hynecek | 257/216 |
| 4,995,061 A | 2/1991 | Hynecek | 377/58 |
| 5,044,000 A * | 8/1991 | Iijima | 377/60 |
| 5,134,087 A | 7/1992 | Hynecek | 438/75 |
| 5,151,380 A | 9/1992 | Hynecek | 438/76 |
| 5,286,990 A | 2/1994 | Hynecek | 257/247 |
| 5,341,008 A | 8/1994 | Hynecek | 257/231 |
| 5,402,459 A | 3/1995 | Hynecek | 377/58 |
| 5,424,223 A | 6/1995 | Hynecek | 438/57 |
| 5,453,632 A | 9/1995 | Hynecek | 257/247 |
| 5,471,515 A | 11/1995 | Fossum et al. | 377/60 |
| 5,491,354 A | 2/1996 | Hynecek | 257/239 |
| 5,502,318 A | 3/1996 | Hynecek | 257/216 |
| 5,567,641 A | 10/1996 | Hynecek | 438/146 |
| 6,351,001 B1 * | 2/2002 | Stevens et al. | 257/223 |

* cited by examiner

Primary Examiner—Minh Loan Tran
Assistant Examiner—Thomas L Dickey
(74) Attorney, Agent, or Firm—Dorsey & Whitney LLP

(57) ABSTRACT

A single phase charge-couple device (CCD) transfer device in a substrate of a first conductivity type. The device includes a gated region and a photo-diode region. The gated region includes a gated part and a gate electrode insulatively spaced over the gated part. The photo-diode region includes first, second, and third diode sub-regions. The second diode sub-region is formed of a second conductivity type; the third diode sub-region is formed of the first conductivity type in the second diode sub-region; and the first diode sub-region is formed of the first conductivity type in the second diode sub-region. The first and third diode sub-regions contain different dopant concentrations. The gated part is either a buried channel gated part or a surface channel gated part. The buried channel gated part includes a channel of the second conductivity type and a first gated sub-region formed in the channel.

22 Claims, 7 Drawing Sheets

CMOS COMPATIBLE SINGLE PHASE CCD CHARGE TRANSFER DEVICE

The priority benefit of the Sep. 16, 1998 filing date of provisional application No. 60/100,557 is hereby claimed.

BACKGROUND OF THE INVENTION

1. Field of the Invention

The present invention relates to time delay and integrate sensors (TDI sensors). In particular, the invention relates to a new charge transfer device that is compatible with usual CMOS (complimentary MOS) sensor processing techniques for better integration with CMOS processing.

2. Description of Related Art

Image sensors for Time Delay and Integration (TDI) applications are usually implemented with a CCD (charge coupled device) architecture. TDI image sensors are used in line scan applications where the light level is low or where the speed of the moving image is high. The CCD is clocked so that the charge packets move across the sensor synchronously with the image. In this way, photo-charges generated by particular parts of the image are accumulated in corresponding charge packets as the charge packets are transferred across the sensor. This increases the sensor's sensitivity in low light situations. The conversion from an electron signal to a voltage is done as the charge packets are transferred out of the last row.

Charge transfer cannot typically be achieved in CMOS sensors that are fabricated with CMOS processes. CMOS image sensors can provide many advantages over CCDs, however it is difficult to achieve charge transfer within these devices and this has prevented CMOS image sensors from being configured for TDI operation.

On the other hand, charge transfer within CCDs is possible because of the presence of more than one electrically isolated gate electrode formed of a polycrystalline silicon layer. In CCD processes, these multiple layers are allowed to form overlapping CCD gate electrodes for use in plural phase structures (e.g., three or four phases) in a CCD or in structures where the overlap helps form a potential gradient to define the transfer direction (e.g., as in a two phase structure). The modifications that would be required to implement distinct and overlapping polycrystalline silicon layers in a CMOS process are prohibitive. "Virtual phase" techniques (a form of single phase charge transfer) are known to have previously been used in CCD image sensors. For example, see U.S. Pat. Nos. 4,779,124 and 4,229,752, incorporated herein by reference, both granted to Hynecek.

SUMMARY OF THE INVENTION

It is an object of the present invention to provide a device that achieves charge transfer within a sensor processed using a CMOS manufacturing process which does not require any additional polycrystalline silicon layers as may be found in a typical CMOS process.

These and other objects are achieved in a single phase CCD transfer device that is formed in a substrate of a first conductivity type. The device includes a gated region and a photo-diode region. The gated region includes a gated part formed in the substrate and a gate electrode insulatively spaced over the gated part. The photo-diode region has proximal and distal sides and includes first, second and third diode sub-regions. The proximal side is adjacent to the gated region. The second diode sub-region is formed of a second conductivity type in the substrate; the third diode sub-region is formed of the first conductivity type in the second diode sub-region in the proximal side; and the first diode sub-region is formed of the first conductivity type in the second diode sub-region in the distal side. The first and third diode sub-regions contain different dopant concentrations of a same species so as to generate an internal field that induces charge carriers to drift to the proximal side. The first and third diode sub-regions are formed without self-alignment but sufficiently close as to fringe out either a barrier or a pocket in a potential profile between the distal and proximal sides of the diode region. The gated part is either a buried channel gated part or a surface channel gated part. The buried channel gated part includes a channel of the second conductivity type formed in the substrate and a first gated sub-region formed in the channel with a compensating inclined angle implant that undercuts the gate electrode with a dopant species of an opposite polarity to the polarity of the channel implant. A remaining portion of the channel and the first gated sub-region are of the same conductivity type but provide different densities of majority carriers. The surface channel gated part includes a first gated sub-region formed in the substrate by an inclined angle implant that undercuts the gate electrode with a dopant species of the same type as the dopant species in the substrate. A remaining portion of the gated part is a sub-portion of the substrate.

BRIEF DESCRIPTION OF DRAWINGS

The invention will be. described in detail in the following description of preferred embodiments with reference to the following figures wherein:

FIGS. 3a through 3f are section views depicting the method of fabricating the CCD transfer device depicted in FIG. 1a; and FIGS. 4a through 4c are section views depicting the method of fabricating the CCD transfer device depicted in FIG. 2a.

DETAILED DESCRIPTION OF PREFERRED EMBODIMENTS

Figure 1A:
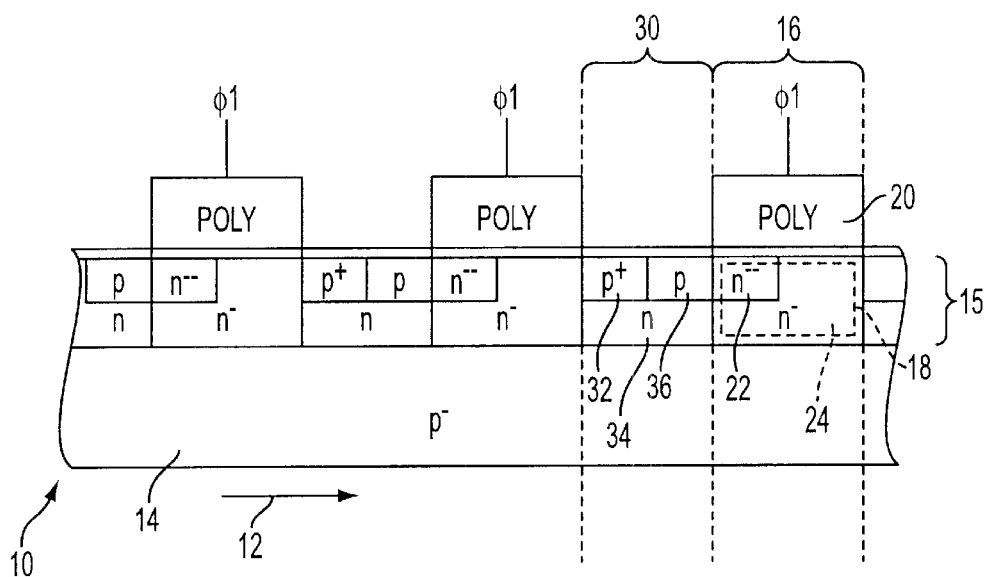
FIG. 1a is a longitudinal section view of a CCD transfer device according to a buried channel gate embodiment of the invention.
Figure 1B:
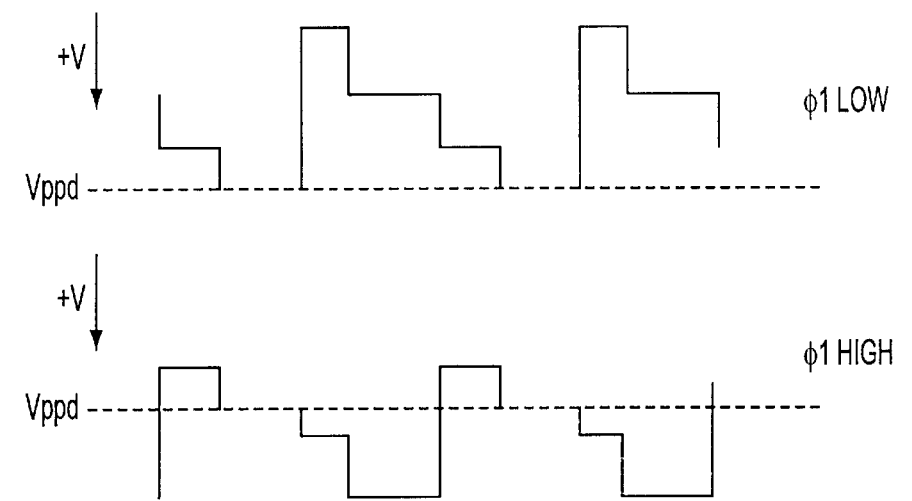
FIG. 1b is a potential profile achieved by the device of FIG. 1a while signal charge is transferred.
Figure 2A:
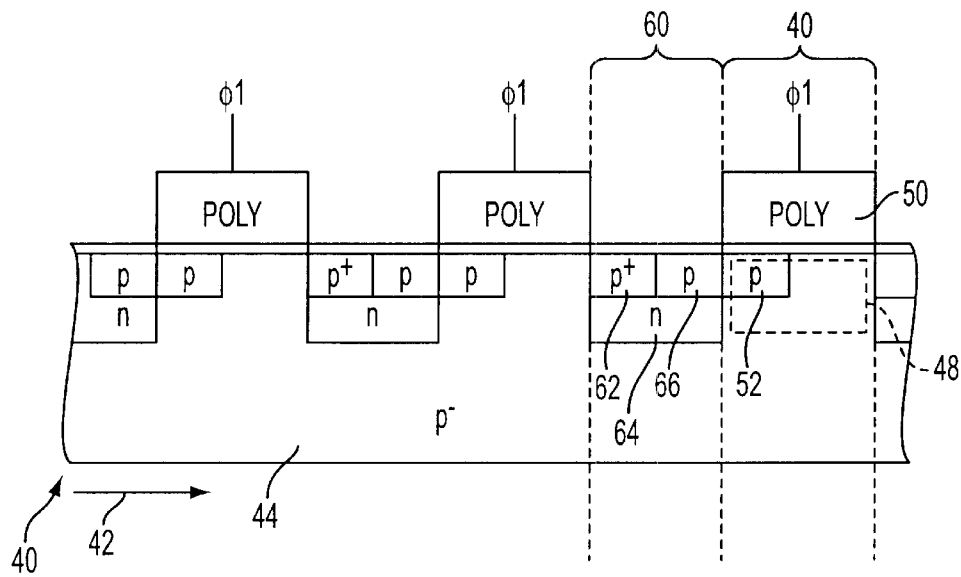
FIG. 2a is a longitudinal section view of a CCD transfer device according to a surface channel gate embodiment of the invention.

Two possible implementations of the present single phase charge transfer device are illustrated in FIGS. 1a and 2a, although the approach is not limited to the two configurations of doping profiles illustrated here. In each case a quasi 2-phase architecture is implemented in which polycrystalline silicon gated storage wells are separated by pinned photodiode storage regions (PPD storage regions). A gated region and adjacent PPD region constitute a pixel (or storage cell). Through the use of dopant species implants, the electric potential beneath each gated region and each PPD region is profiled such that a potential on the right side of each region (as depicted in FIGS. 1a and 2a) is larger (i.e., more positive) than a potential on the left side of each region (as depicted in FIGS. 1a and 2a). It will be appreciated that the potential diagrams are drawn with a more positive potential (which attracts electrons) depicted "down". The corresponding potential profile diagrams are FIGS. 1b and 2b (note that the potential diagrams are illustrated for each of φ1 "Low" and φ1 "High"). Charge transfer is achieved by clocking the polycrystalline silicon gates (clock voltage (PI) between "High" and "Low" thereby moving the potentials in the regions beneath the polycrystalline silicon up and down (i.e., more negative, and more positive). The potentials in the PPD regions remain fixed as indicated in the diagrams by the reference potential Vppd. For example, the p conductivity type silicon that forms the PPD may be formed so as to be in contact with channel stops at the side of the storage cell. In this way, the potential on the PPD is defined by the potential on a channel stop and is ordinarily set equal to (by one means or another) the potential on the substrate. Of course, in the present embodiment the use of specific p conductivity type regions and n conductivity type regions facilitates charge transfer by transferring electrons. It would be appreciated that interchanging p and n conductivity types would facilitate charge transfer by transferring "holes".

Figure 3A:
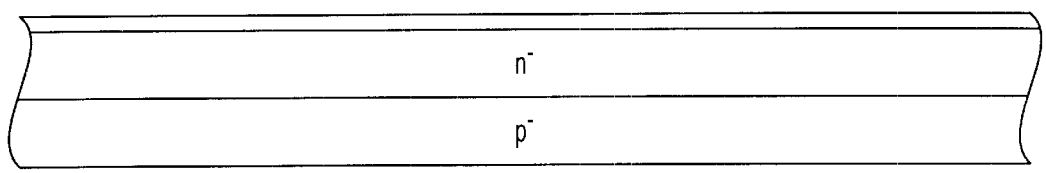

In FIG. 3a, a low level of an n type dopant species (e.g., phosphorus or arsenic) is "blanket" implanted (or diffused) into a lightly doped p type semiconductor wafer or semiconductor layer (denoted $p^-$) on any other suitable substrate to form an n type layer (denoted $n^-$) at the substrate surface. A "blanket" implant is a uniform implant that is not masked or patterned. Suitable substrates include semiconductor wafers and epitaxially grown layers on most any other material type (e.g., sapphire, diamond, copper, etc.). The substrate is then patterned (masked with a pattern), and heavily doped p type linear channel stops are formed in the $n^-$ type layer to define channels therebetween. The channel stops may be formed deep enough in the $n^-$ type layer to contact the $p^-$ type substrate beneath to define and completely isolate the longitudinal channels between adjacent channel stops. Then, an insulation film (e.g., an oxide) is formed over the substrate. FIG. 3a depicts a longitudinal section through a channel.

Figure 3B:
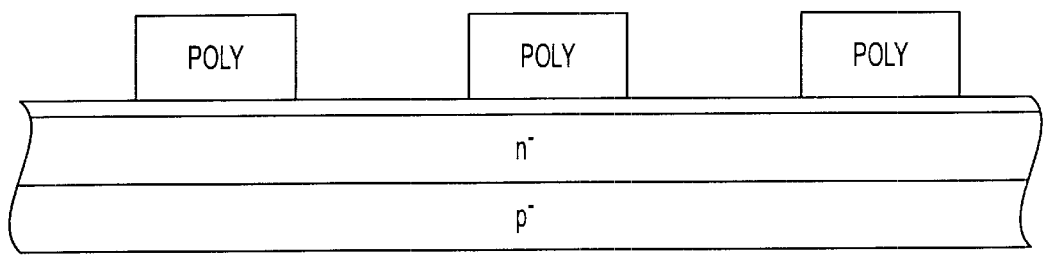

In FIG. 3b, a conductive layer of doped polycrystalline silicon (hereinafter poly) is formed on the insulation layer and then patterned and etched so as to form poly gate electrodes that traverse the channels, preferably perpendicular to the channels. This defines plural gate regions (under the poly gate electrodes) and diode regions between the gate regions in each channel.

Figure 3C:
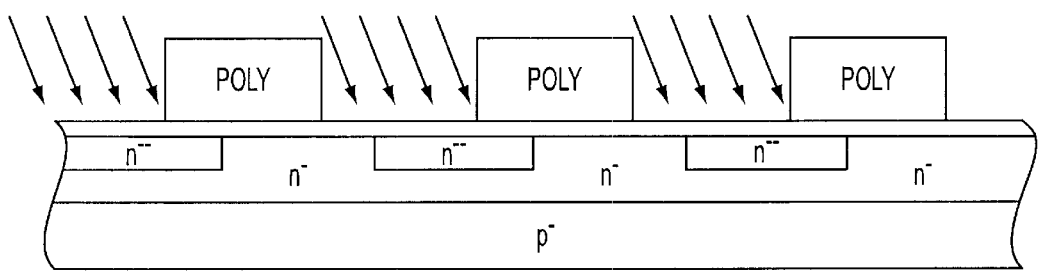

In FIG. 3c, a fluence of p type dopant species (e.g., boron or aluminum) is blanket implanted at an inclined angle so that dopant atoms are implanted under a first side of each poly gate electrode (i.e., the undercut side of each poly gate electrode). An ion beam acceleration voltage of the implant machine provides a control to set the average depth of the implanted atoms. The insulation film formed during processes described with regard to FIG. 3a is thin enough to permit implanted dopant atoms to pass through the insulation film into the semiconductor layer beneath. In contrast, the poly gate electrodes are sufficiently thick to block penetration of the dopant atoms into the gate regions, and thus, the poly gate electrodes serve as a mask. However, the inclined implant configuration presents a thin edge of poly at the edge of the poly gate electrode through which dopant atoms are implanted into the semiconductor layer beneath the first side of each poly gate electrode.

The dopant species implanted at the inclined angle is a compensating implant of opposite polarity to the polarity of the dopant species that forms the channel. For example, the n type dopant species (e.g., phosphorus or arsenic) that forms a channel, as discussed with regard to FIG. 3a, is compensated by a p type dopant species (e.g., boron or aluminum). Phosphorus (or arsenic) contributes one free electron in the conduction band (i.e., majority carriers) for each atom implanted to create an n conductivity type semiconductor. The further implanting of a p type dopant species (e.g., boron or aluminum) absorbs one free electron for each atom implanted and binds it into the valence band to reduce the number of free electrons in the conduction band. In this way a reduced density of majority carriers (i.e., electrons for the n conductivity type) is created in one region (depicted as the $n^{--}$ region) within the larger channel region (depicted as the $n^-$ region). However, both regions are still maintained to be of the n conductivity type so that the gate will operate as a buried channel gate.

The potential of the channel beneath the gate electrode has a stair step profile stepping from a low potential (more negative) under the undercut side of the poly gate electrode to a high potential (more positive) under the non-undercut side of the poly gate electrode. The potential difference between the channel portion beneath the undercut side of the poly gate electrode (i.e., the undercut channel portion) and the channel portion beneath the non-undercut side of the poly gate electrode (i.e., the non-undercut channel portion) is at least partially defined by the quantity of p type dopant atoms deposited under the first side of the poly gate electrode during this angle implant. The potential difference between the low potential (more negative) under the undercut side of the poly gate electrode and the high potential (more positive) under the non-undercut side of the poly gate electrode establishes an internal electric field. Free electrons drift under the influence of this internal electric field toward the high potential (non-undercut) side of the poly gate electrode. However, the absolute potential under the undercut side (and consequently the non-undercut side as well) may be selectively induced by applying a control or clock voltage to the poly gate electrode.

Figure 3D:
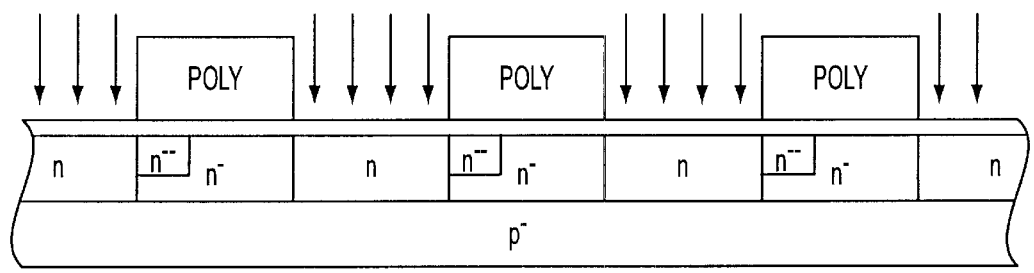

In FIG. 3d, a fluence of n type dopant species is blanket implanted at a vertical angle and with a sufficient acceleration voltage to implant at a greater depth than the depth of the angle implant illustrated in FIG. 3c. This increases the n type dopant concentration in the diode region (i.e., between gate regions) and is depicted as n instead of $n^-$ as in the buried channel of the gate region.

Figure 3E:
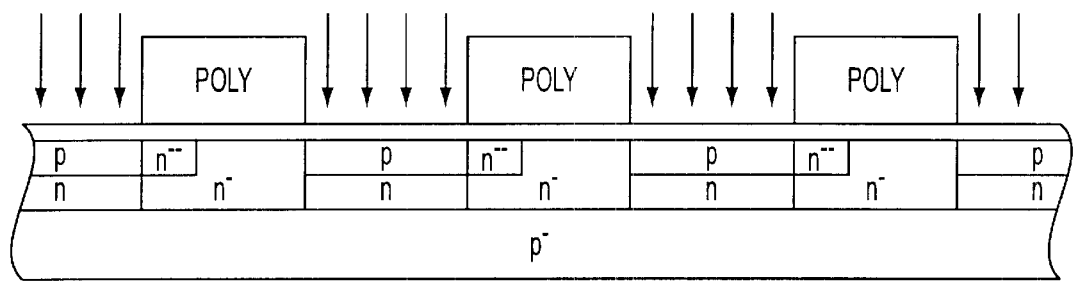

In FIG. 3e, a fluence of p type dopant species is blanket implanted at a vertical angle and with a lesser accelleration voltage to implant the p type dopant species at a shallower depth than the depth of the vertical n type implant illustrated in FIG. 3d. The shallow p type layer electrically communicates with the p type channel stops disposed on lateral sides of the channel, thus creating a pinned photo diode. The shallow p type layer on top of the n type region isolates the n type diode region from surface effects. When the channel stops are deep enough to contact or penetrate the $p^-$ substrate, the n type diode region is encircled (except for the gates on either end) in a p type cylinder formed by the shallow p implant on the top, the p type channel stops on the lateral sides and the $p^-$ substrate on the bottom. The potential of the diode's n type region is generally set and cleared from the adjacent gate regions.

Figure 3F:
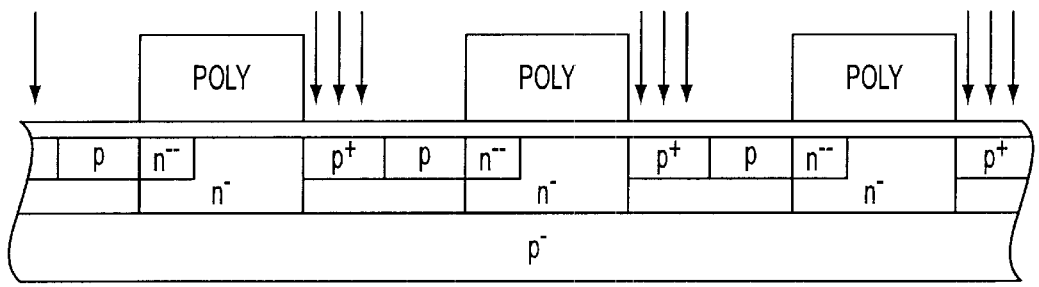

In FIG. 3f, the semiconductor wafer is patterned with a mask that blocks implants on a side of the diode region adjacent to the first side of the poly gate electrode. Then, a fluence of p type dopant species is implanted over the patterned mask at a vertical angle and with the same acceleration voltage as used in the step illustrated in FIG. 3e to form a more highly doped region denoted $p^+$, and then the patterned mask is removed. The potential of the diode is "pinned" to the potential of the channel stops. The potential of the channel stops is generally set to the potential of the substrate. The patterned mask used in FIG. 3f need not be too carefully aligned. Self-aligning techniques (with respect to the poly gate electrode) is unnecessary since the alignment of the mask used in FIG. 3f merely divides the photo diode into two regions to establish a potential profile. Any pockets or barriers created by overlaps and gaps at the potential step are fringed out if reasonable alignment accuracy is achieved.

The quantity of p type dopant species implanted in the diode region at the shallow depth on the side adjacent to the undercut side of the poly gate electrode (denoted p) is less than the quantity implanted on the opposite side of the diode region at the shallow depth (denoted $p^+$). Thus, the potential in the n region of the pinned photo diode will have a stair step profile stepping from a low potential (more negative) under the $p^+$ type region to a high potential (more positive) under the p type region. The potential difference between the low potential (more negative) side of the n type layer under the $p^+$ shallow region and the high potential (more positive) side of the n type layer under the p shallow region establishes an internal electric field and is at least partially defined by the difference in the quantity of p type dopant atoms deposited in the $p^+$ type region and in the p type region of the diode region. Photo-generated electrons drift under the influence of this internal electric field toward the high potential side (i.e., under the p type shallow implant). The absolute potential is defined relative to the substrate since the diode is a pinned photo diode that is pinned to the potential of the substrate.

In FIG. 1a, CCD 10 is formed on substrate 14. Channel 15 is formed in substrate 14. Substrate 14 is preferably of a p conductivity type (denoted $p^-$) and channel 15 is preferably of an n conductivity type (denoted $n^-$). Pluses (i.e., "+") and minuses (i.e., "−") that follow a conductivity types denote relative concentrations of carriers. The CCD includes buried channel gate 16 and pinned photo diode 30 and defines transfer direction 12. The diode has proximal and distal edges, and the proximal edge of diode 30 is adjacent to gate 16. TDI column structures are formed from plural CCDs 10 linked in series. The distal edge of diode 30 is the edge adjacent to a gate of an adjacent CCD 10. Gate 16 has a first extent in the transfer direction.

Gate 16 includes a buried channel part 18 and polycrystalline silicon gate electrode 20 insulatively spaced over buried channel part 18. Part 18 is a part of buried channel 15 that lies within the extent of gate 16.

Part 18 includes first gated sub-region 22 and second gated sub-region 24. Second gated sub-region 24 is formed out of n channel 15 that was formed in $p^-$ substrate 14. First gated sub-region 22 is formed by the p type dopant species implanted into the $n^-$ channel at an inclined angle under the first side of the poly gate electrode and into second gated sub-region 24. The first and second gated sub-regions may be formed to a same depth since this provides the desired stair step potential profile. However, first gated sub-region 22 is usually formed to a first depth that is less than a second depth characterizing the second gated sub-region (also forming the desired stair step potential) since first gated sub-region 22 is usually formed in the same inclined angle implant step as is used to form third diode sub-region 36, and third diode sub-region 36 is formed less deep than second diode sub-region 34. The second gated sub-region has an extent in the transfer direction equal to the first extent, and the first gated sub-region has an extent in the transfer direction less than the first extent.

Diode region 30, preferably a pinned photo-diode, has a second extent in the transfer direction and is disposed adjacent to the gated region. Diode region 30 includes first diode sub-region 32 of a p conductivity type (denoted $p^+$), second diode sub-region 34 of an n conductivity type (denoted n) formed (by additional n type implants) in $n^-$ channel 15 to the second depth and third diode sub-region 36 of a p conductivity type (denoted p). First diode sub-region 32 is formed with an implant that is self aligned with the distal edge of diode region 30, the gate electrode of a gated region in an adjacent CCD 10 forming a mask for this self alignment. The first and third diode sub-regions are formed in the second diode sub-region to the first depth that is less that the second depth.

Third diode sub-region 36 is formed with the first concentration of dopant species (denoted p). The first'diode sub-region is formed with a second concentration of dopant species (denoted $p^+$) greater than the first concentration. The third diode sub-region has an extent in the transfer direction less than the second extent, the first diode sub-region has an extent in the transfer direction equal to the second extent less the extent of the third diode sub-region, and the second diode sub-region has an extent in the transfer direction equal to the second extent.

In practice the mask that blocks further implants into third diode sub-region 36 and permits further p type implants into first diode sub-region 32 needs to be only roughly aligned so as to overlap the poly gate electrode on one side and define a non-self-aligned edge between sub-regions 32 and 36 on the other side.

In operation a clock voltage is applied to electrode 20. The clock voltage varies between (φ1 High and φ1 Low. The potential profile of the diode region is predetermined by the concentrations of dopant species and types implanted into channel 15 and sub-regions 32, 34 and 36. The potential profile of the gated region is in part predetermined by the dopant species concentration and types in sub-regions 22 and 24 (actually channel 15), but is also determined by the applied clock voltage of either φ1 High or φ1 Low. The applied clock voltage cycles between φ1 High and φ1 Low and has the effect of pumping the CCD so as to transfer charge in transfer direction 12 as depicted in the potential diagrams of FIG. 1b where Vppd is a fixed voltage relative to the substrate at which the.. pinned photo-diode is pinned (e.g., to the substrate reference).

Figure 4A:
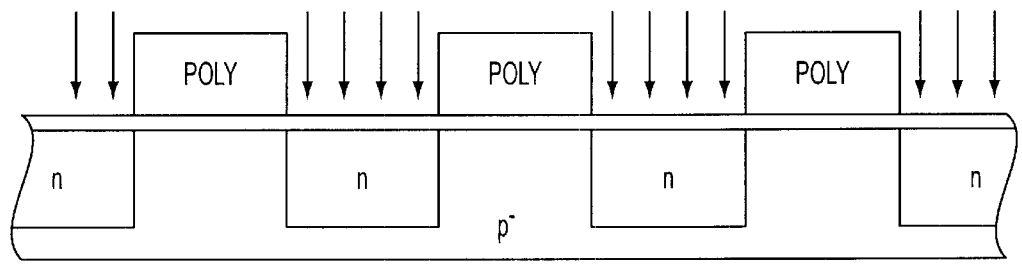

In FIG. 4a, longitudinal lines of field oxide or implanted channel stops are formed in a $p^-$ type substrate to define a channel direction, and then a thin insulation film is formed over the $p^-$ type substrate. For example, the substrate may be a lightly doped p type semiconductor wafer or a semiconductor layer (denoted $p^-$) grown on any other suitable material. Suitable substrates include semiconductor wafers and epitaxially grown layers on many other types of materials (e.g., sapphire, diamond, copper, etc.). A poly film is deposited, patterned and etched to form a plurality of poly gate electrodes transverse to the channel direction. Next, if implanted channel stops are used, a mask is deposited and patterned into lines wide enough to cover the channel stops. A fluence of n type dopant species (e.g., phosphorus or arsenic) is blanket implanted at a vertical angle and with a sufficient acceleration voltage to implant dopant atoms through the thin insulation film into the substrate but be blocked by both the patterned mask (or field oxide) and the plurality of poly gate electrodes. The patterned mask, if used, is then removed. A region unobscured by both the patterned mask (or field oxide) and the poly gate electrodes becomes a diode of an n conductivity type that is disposed between and self-aligned with the poly gate electrodes. A region under a poly gate electrode becomes a gate region (between adjacent diodes in the channel direction) of a surface channel type.

Figure 4B:
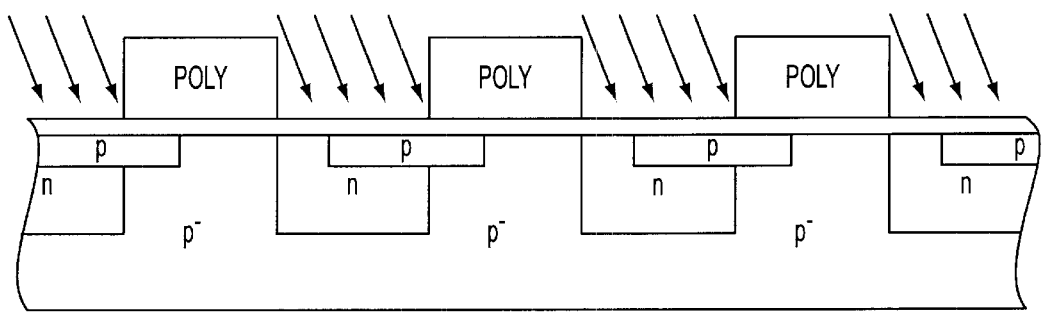

In FIG. 4b, a fluence of p type dopant species (e.g., boron or aluminum) is blanket implanted at an inclined angle so that dopant atoms are implanted under a first side of each poly gate electrode (i.e., the undercut side of each poly gate electrode). The angled implant also implants the p type dopant species on a first side of the diode region that is adjacent to the poly gate electrode (to be referred to as a proximal side). An ion beam acceleration voltage of the implant machine provides a control to set the average depth of the implanted atoms. The insulation film formed during processes described with regard to FIG. 4a is thin enough to permit implanted dopant atoms to pass through the insulation film into the semiconductor layers beneath. In contrast, the poly gate electrodes are of sufficient thickness to block penetration of the dopant atoms into the gate regions, and thus, the poly gate electrodes serve as a mask. However, the inclined implant configuration presents a thin edge of poly at the edge of the poly gate electrode through which dopant atoms are implanted into the semiconductor layer beneath the first side of each poly gate electrode.

The quantity of dopant species implanted at the inclined angle under the first side of the poly gate electrode reduces the potential (i.e., makes the potential more negative) under the undercut side of the poly gate electrode. The gate operates as a surface channel gate, where the potential of the surface channel beneath the gate electrode has a stair step profile stepping from a low potential (more negative) under the undercut side of the poly gate electrode to a high potential (more positive) under the non-undercut side of the poly gate electrode. The potential difference between the low potential (more negative) side under the undercut side of the poly gate electrode (i.e., the undercut channel portion) and the high potential (more positive) side under the non-undercut side of the poly gate electrode (i.e., the non-undercut channel portion) establishes an internal electric field and is at least partially defined by the quantity of p type dopant atoms deposited under the first side of the poly gate electrode during this angle implant. Free electrons drift under the influence of this internal electric field toward the high potential (non-undercut) side of the poly gate electrode. However, the absolute potential under the undercut side (and consequently the non-undercut side as well) may be selectively induced by applying a control or clock voltage to the poly gate electrode.

Figure 4C:
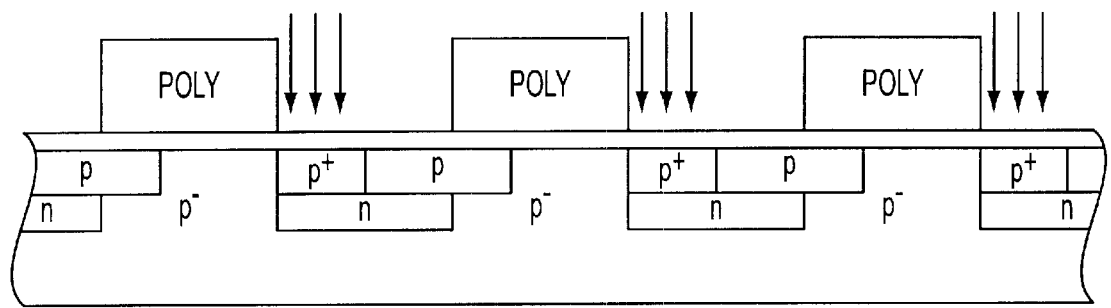

In FIG. 4c, the semiconductor wafer is covered with a mask that is patterned to form lines parallel with and overlapped on the poly gate electrodes so as to block implants on the proximal side of the diode region but permit implants on a distal side opposite the proximal side. Then, a fluence of p type dopant species (e.g., boron or aluminum) is implanted over the patterned mask at a vertical angle and with a lesser acceleration voltage than was used in the processes described with regard to FIG. 4a to form a more highly doped region denoted p$^+$, and then the patterned mask is removed. The patterned mask used in FIG. 4c need not be too carefully aligned. Self-aligning techniques (with respect to the poly gate electrode) are unnecessary since on one side the mask merely overlaps the poly gate electrodes and on other side of the line the alignment of the mask used in FIG. 4c merely divides the photo diode into two regions (p$^+$ and p) to establish a potential profile. Any pockets or barriers created by overlaps and gaps at the potential step are fringed out if reasonable alignment accuracy is achieved.

The quantity of p type dopant species implanted in the diode region at the shallow depth on the proximal side of the diode region (i.e., adjacent to the undercut side of the poly gate electrode and denoted p) is less than the quantity implanted on the distal side of the diode region at the shallow depth (denoted p$^+$). Thus, the potential in the n region of the photo diode will have a stair step profile stepping from a low potential (more negative) under the p$^+$ type region to a high potential (more positive) under the p type region. The potential difference between the low potential (more negative) side of the n type layer under the p$^+$ shallow region and the high potential (more positive) side of the n type layer under the p shallow region establishes an internal electric field and is at least partially defined by the difference in the quantity of p type dopant atoms deposited in the p$^+$ type region and in the p type region of the diode region. Photo-generated electrons drift under the influence of this internal electric field toward the high potential side (i.e., under the p type shallow implant).

In FIG. 2a, CCD 40 is formed in substrate 44. Substrate 44 is preferably of a p conductivity type of a low concentration of dopant species (denoted p$^-$). The CCD defines transfer direction 42 and includes gated region 46 and diode region 60. The gated region has a first extent in the transfer direction. Gated region 46 includes gated part 48 formed in substrate 44 and polycrystalline silicon gate electrode 50 insulatively spaced over the gated part. Gated part 48 includes first gated sub-region 52 formed in the substrate, the first gated sub-region being formed of a p conductivity type (denoted p) to a first depth with a first concentration of dopant species (denoted p) greater than the low concentration (denoted p$^-$). The first gated sub-region has an extent in the transfer direction less than the first extent.

Diode region 60 has a second extent in the transfer direction and is disposed adjacent to the gated region. Diode region 60, preferably a pinned photo-diode, includes first diode sub-region 62 of a p conductivity type (denoted p$^+$), second diode sub-region 64 of an n conductivity type formed in substrate 44 to a second depth and third diode sub-region 66 of a p conductivity type (denoted p). The first and third diode sub-regions are formed in the second diode sub-region to the first depth. Third diode sub-region 66 is formed with the first concentration of dopant species (denoted p) integral with first gated sub-region 52. In its more general form, first gated sub-region 52 and third diode sub-region 66 need not be formed with the same concentration of dopant impurities and may be realized with distinct implants. However, in practice, the use of a single implant to produce these regions has big advantages: fewer mask steps and most importantly, the lack of a necessity for fine alignment of the implant mask edge relative to the poly mask edge. The first diode sub-region is formed with a second concentration of dopant species (denoted p$^+$) greater than the first concentration. The third diode sub-region has an extent in the transfer direction less than the second extent, the first diode sub-region has an extent in the transfer direction equal to the second extent less the extent of the third diode sub-region, and the second diode sub-region has an extent in the transfer direction equal to the second extent.

In operation a clock voltage is applied to electrode 50. The clock voltage varies between $\phi$1 High and $\phi$1 Low. The potential profile of the diode region is predetermined by the concentrations of dopant species in substrate 44 and in sub-regions 62, 64 and 66. The potential profile of the gated region is in part predetermined by the dopant species concentration and types in sub-region 52 and substrate 44, but is also determined by the applied clock voltage of either $\phi$1 High or $\phi$1 Low. The applied clock voltage cycles between $\phi$1 High and $\phi$1 Low and has the effect of pumping the CCD so as to transfer charge in transfer direction 42 as depicted in the potential diagrams of FIG. 2b where Vppd is a fixed voltage relative to the substrate at which the pinned photo-diode is pinned (e.g., to the substrate reference).

Figure 2B:
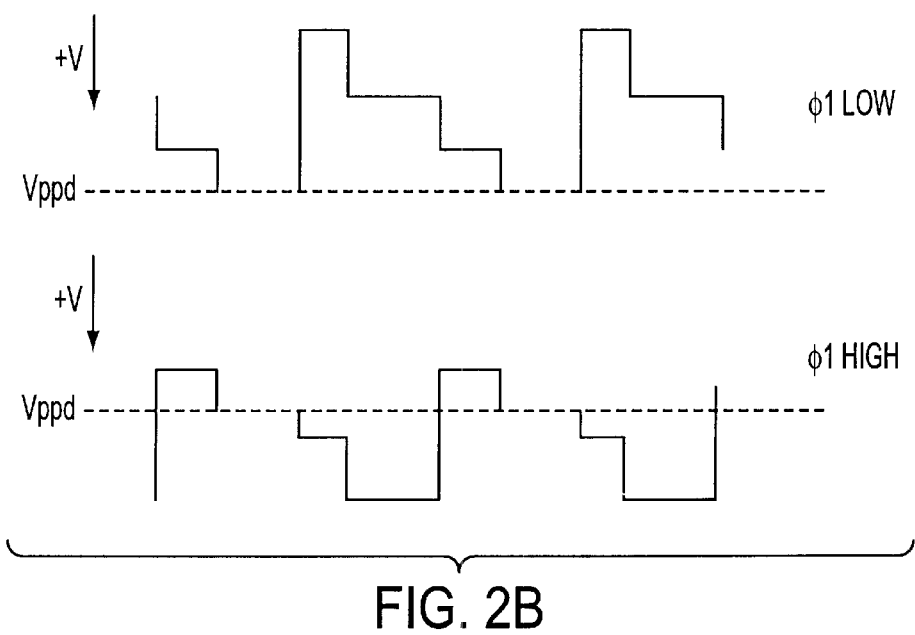
FIG. 2b is a potential profile achieved by the device of FIG. 2a while signal charge is transferred.

The signal charge pools in the right hand side of the PPD regions (as depicted in FIGS. 1b and 2b) when φ1 is "Low" and in the right hand side of the poly gated regions when φ1 is "High". Charge transfer therefore takes place from left to right and the complete transfer of a pixel charge pocket occurs when φ1 is clocked from "Low" to "High" and then back to "Low" again.

The two implementations differ somewhat. The configuration illustrated in FIG. 1a has a buried channel architecture in each of the gated and the PPD regions. In FIG. 2a, the PPD region is a fully buried channel structure, but the gated region is an induced surface channel structure. Buried channel transfer schemes are ordinarily more efficient than surface channel transfer schemes. Therefore, the net charge transfer efficiency will ordinarily be better for the configuration in FIG. 1a than for that in FIG. 2a. However, surface channel transfer schemes are sufficient for many applications, particularly CMOS image sensor applications where charge transfer takes place within a pixel or within a few pixels.

The use of PPD regions (e.g., photo diode regions 30 or 60 in FIGS. 1a or 2a, respectfully) allows for at least one half of each pixel to be free of any overlying gate material such as gate electrodes in gated regions 16 or 46 in FIGS. 1a or 2a, respectfully. This has the added advantage of allowing for enhanced photo-response for short wavelength light since short wavelength light is partially absorbed by poly gate electrodes.

In FIG. 3c, leading to the structure of FIG. 1a, the p implant that produces the n⁻⁻ region spans a region between gated region 16 and photo-diode region 30, and therefore, need not be aligned to a poly-edge. The following n implant described with regard to FIG. 3d is self-aligned to the poly edge, thus "trimming" the n⁻⁻ region (sub-region 22) to be limited to the region under the poly gate electrode. The other portion of the n⁻⁻ region is changed to an n region by the addition of the n type dopant atoms during the implant described with respect to FIG. 3d that defines the photo diode region and is self-aligned with the adjacent poly gate electrode edges. Similarly, in FIG. 2a, the p implant region (i.e., sub-regions 52 and 66) spans a region between gated region 46 and photo-diode region 60, and therefore, need not be aligned to a poly gate electrode edge. Preferably, a common implant is used to form the n⁻⁻ region depicted in FIG. 3c when making the structure of FIG. 1a or a common implant is used to form sub-regions 52 and 66 in FIG. 2a. This common implant reduces the number of separate implant steps required to be added to a CMOS process to achieve a CMOS imaging sensor, and at the same time, eliminates misalignment errors.

Furthermore, the p⁺ implant regions (i.e., sub-regions 32 and 62 in FIGS. 1a and 2a, respectively) are self aligned to an edge of the poly gate electrode. Then, the only potential implant alignment issue is between sub-regions 32 and 36 in FIG. 1a and between sub-regions 62 and 66 in FIG. 2a. However, implant misalignment at this interface is relatively easy to "fringe out". For example, even though a misalignment error may ordinarily produce a barrier (overlapping implants) or pocket (gap in the implants), when the misalignment error is in the order of a micron, fringe effects in the electrical potential reduce or eliminate the pocket or barrier. The misalignment errors at a poly edge are more difficult to "fringe out" than are misalignment errors between sub-regions 32 and 36 in FIG. 1a and between sub-regions 62 and 66 in FIG. 2a. Known virtual phase architectures do not have this structure, and the alignment tolerance advantages provided by this structure are not known.

Having described preferred embodiments of a novel single phase CCD shift register compatible with CMOS manufacturing processes (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims.

What is claimed is:

1. A device formed in a substrate of a first conductivity type, the device comprising:

a gated region that includes a gated part and a gate electrode insulatively spaced over the gated part; and a photo-diode region having proximal and distal sides, the proximal side being adjacent to the gated region, the photo-diode region including first, second and third diode sub-regions, the second diode sub-region being formed of a second conductivity type in the substrate, the third diode sub-region being formed of the first conductivity type in the second diode sub-region in the proximal side, the first diode sub-region being formed of the first conductivity type in the second diode sub-region in the distal side, a first dopant species constituting a highest concentration of any dopant species in both the first and third diode sub-regions, wherein the first and third diode sub-regions contain different dopant concentrations of the first dopant species.

2. A device formed in a substrate of a first conductivity type, the device comprising:

a gated region that includes a gated part and a gate electrode insulatively spaced over the gated part; and a photo-diode region having proximal and distal sides, the proximal side being adjacent to the gated region, the photo-diode region including first, second and third diode sub-regions, the second diode sub-region being formed of a second conductivity type in the substrate, the third diode sub-region being formed of the first conductivity type in the second diode sub-region in the proximal side, the first diode sub-region being formed of the first conductivity type in the second diode sub-region in the distal side, wherein the first and third diode sub-regions contain different dopant concentrations of a same species so as to generate an internal field that induces charge carriers to drift to the proximal side.

3. A device formed in a substrate of a first conductivity type, the device comprising:

a gated region that includes a gated part and a gate electrode insulatively spaced over the gated part, the gated part including a channel of a second conductivity type formed in the substrate and a first gated sub-region formed in the channel so as to define a second gated sub-region as a remaining portion of the channel; and a photo-diode region having proximal and distal sides, the proximal side being adjacent to the first gated sub-region, the photo-diode region including first, second and third diode sub-regions, the second diode sub-region being formed of the second conductivity type in the substrate, the third diode sub-region being formed of the first conductivity type in the second diode sub-region in the proximal side, the first diode sub-region being formed of the first conductivity type in the second diode sub-region in the distal side, and wherein the first gated sub-region provides a lesser density of majority carriers than is provided by the second gated sub-region.

4. The device of claim 3, wherein:

the second gated sub-region includes a dopant species of a first polarity type; and the first gated sub-region is of the second conductivity type and includes the dopant species of the first polarity type and a dopant species of a second polarity type, the second polarity type being opposite to the first polarity type.

5. The device of claim 3, wherein:

the channel includes a dopant species of a first polarity type; and the first gated sub-region includes a dopant species of a second polarity type, the second polarity type being an opposite polarity to the first polarity type.

6. The device of claim 3, wherein:

a first dopant species constitutes a highest concentration of any dopant species in both the first and third diode sub-regions; and the first and third diode sub-regions contain different dopant concentrations of the first dopant species.

7. A device formed in a substrate of a first conductivity type, the device comprising:

a gated region that includes a gated part and a gate electrode insulatively spaced over the gated part; and a photo-diode region having proximal and distal sides, the proximal side being adjacent to the gated region, the photo-diode region including first, second and third diode sub-regions, the second diode sub-region being formed of a second conductivity type in the substrate, the third diode sub-region being formed of the first conductivity type in the second diode sub-region in the proximal side, the first diode sub-region being formed of the first conductivity type in the second diode sub-region in the distal side, wherein the second diode sub-region is self-aligned with the gate electrode and a gate electrode of an adjacent device abutting the distal side, and wherein the first diode sub-region is self aligned with the gate electrode of the adjacent device abutting the distal side.

8. A device formed in a substrate of a first conductivity type, the device comprising:

a gated region that includes a gated part and a gate electrode insulatively spaced over the gated part, the gated part including a first gated sub-region formed in the substrate and a remaining portion of the gated part that is constituted by a sub-portion of the substrate; and a photo-diode region having proximal and distal sides, the proximal side being adjacent to the gated region, the photo-diode region including first, second and third diode sub-regions, the second diode sub-region being formed of a second conductivity type in the substrate, the third diode sub-region being formed of the first conductivity type in the second diode sub-region in the proximal side, the first diode sub-region being formed of the first conductivity type in the second diode sub-region in the distal side.

9. The device of claim 8 wherein:

the remaining portion includes a dopant species of a first polarity type in a concentration to define a first majority carrier density; and the first gated sub-region includes the dopant species of the first polarity type in a concentration to define a second majority carrier density, the second majority carrier density being greater than the first majority carrier density.

10. The device of claim 8, wherein the first gated sub-region is formed in the substrate so as to provide a stair step potential profile in the gated region.

11. The device of claim 8, wherein the first gated sub-region is formed to be of the first conductivity type.

12. The device of claim 8, wherein:

the remaining portion includes a dopant species of a first polarity type in a concentration to define a first majority carrier density; and the first gated sub-region includes the dopant species of the first polarity type in a concentration to define a second majority carrier density, the second majority carrier density being greater than the first majority carrier density.

13. The device of claim 12, wherein the first and third diode sub-regions contain different dopant concentrations of a same species.

14. The device of claim 8, wherein the first gated sub-region is formed in the substrate so as to provide a stair step potential profile in the gated region.

15. A device formed in a substrate of a first conductivity type, the device comprising:

a gated region that includes a gated part and a gate electrode insulatively spaced over the gated part, the gated part including a first gated sub-region formed in the substrate and a remaining portion of the gated part, the remaining portion being a sub-portion of the substrate; and a photo-diode region having proximal and distal sides, the proximal side being adjacent to the gated region, the photo-diode region including first, second and third diode sub-regions, the second diode sub-region being formed of a second conductivity type in the substrate, the third diode sub-region being formed of the first conductivity type in the second diode sub-region in the proximal side, the first diode sub-region being formed of the first conductivity type in the second diode sub-region in the distal side, wherein the second diode sub-region is self-aligned with the gate electrode and a gate electrode of an adjacent device abutting the distal side, and wherein the first diode sub-region is self aligned with the gate electrode of the adjacent device abutting the distal side.

16. A device formed in a substrate of a first conductivity type, the device comprising:

a gated region that includes a gated part and a gate electrode insulatively spaced over the gated part, the gated part including a channel of a second conductivity type formed in the substrate and a first gated sub-region formed in the channel so as to define a second gated sub-region as a remaining portion of the channel, the second gated sub-region having a greater density of majority carriers than the first gated sub-region; and a photo-diode region having proximal and distal sides, the proximal side being adjacent to the region, the photodiode region including first, second and third diode sub-regions, the second diode sub-region being formed of the first conductivity type in the second diode sub-region in the proximal side, the first diode sub-region being formed of the first conductivity type in the second diode sub-region in the distal side.

17. A device formed in a substrate of a first conductivity type, the device comprising:

a gated region that includes a gated part and a gate electrode insulatively spaced over the gated part, the gated part including a channel of a second conductivity type formed in the substrate and a first gated sub-region of the second conductivity type formed in the channel so as to define a second gated sub-region as a remaining portion of the channel, the first and second gated sub-regions including a dopant species of a first polarity type, the dopant species of the first polarity type constituting a highest concentration of any dopant species in both the first and second gated sub-regions, the first gated sub-region including a dopant species of a second polarity type, the second polarity type being opposite to the first polarity type; and photo-diode region having proximal and distal sides, the proximal side being adjacent to the gated region, the photo-diode region including first, second and third diode sub-regions, the second diode sub-region being formed of the second conductivity type in the substrate, the third diode sub-region-being formed of the first conductivity type in the second diode sub-region in the proximal side, the first diode sub-region being formed of the first conductivity type in the second diode sub-region in the distal side.

18. The device of claim 17, wherein the first gated sub-region further includes the dopant species of the first polarity type.

19. The device of claim 17, wherein:

the third diode sub-region includes the dopant species of the second polarity type;

the first diode sub-region includes one of the dopant species of the second polarity type and another dopant species of the second polarity type; and the first and third diode sub-regions contain different dopant concentrations of the second polarity type.

20. The device of claim 17, wherein the dopant species of the second polarity type is absent from the second gated sub-region.

21. A device formed in a substrate of a first conductivity type, the device comprising:

a gated region that includes a gated part and a gate electrode insulatively spaced over the gated part; and a photo-diode region having proximal and distal sides, the proximal side being adjacent to the gated region, the photo-diode region including first, second and third diode sub-regions, the second diode sub-region being formed of a second conductivity type of substantially uniform concentration in the substrate, the third diode sub-region being formed of the first conductivity type in the second diode sub-region in the proximal side, the first diode sub-region being formed of the first conductivity type in the second diode sub-region in the distal side.

22. A device formed in a substrate of a first conductivity type, the device comprising:

a gated region that includes a gated part and a gate electrode insulatively spaced over the gated part; and a photo-diode region having proximal and distal sides, the proximal side being adjacent to the gated region, the photo-diode region including first, second and third diode sub-regions, the second diode sub-region being formed of a second conductivity type in the substrate and being self-aligned with the gate, electrode and a gate electrode of an adjacent device abutting the distal side, the third diode sub-region being formed of the first conductivity type in the second diode sub-region in the proximal side, the first diode sub-region being formed of the first conductivity type in the second diode sub-region in the distal side and being self aligned with the gate electrode of the adjacent device abutting the distal side.

* * * * *